United States Patent
Lee et al.

(10) Patent No.: US 7,109,080 B2
(45) Date of Patent: Sep. 19, 2006

(54) METHOD OF FORMING CAPACITOR OVER BITLINE CONTACT

(75) Inventors: Yong-Woo Lee, Seoul (KR); Jong-Chul Park, Suwon-si (KR); O-Ik Kwon, Sungnam-si (KR); Sang-Sup Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/033,447

(22) Filed: Jan. 12, 2005

(65) Prior Publication Data

US 2005/0196921 A1    Sep. 8, 2005

(30) Foreign Application Priority Data

Jan. 12, 2004    (KR) .................. 10-2004-0001966

(51) Int. Cl.
*H01L 21/8242*    (2006.01)

(52) U.S. Cl. .................. 438/253; 438/256; 438/396; 438/399; 438/639; 438/672; 438/696; 438/700

(58) Field of Classification Search ................ 438/253, 438/256, 396, 399, 639, 672, 696, 700
See application file for complete search history.

(56) References Cited

U.S. PATENT DOCUMENTS

| | | | | |
|---|---|---|---|---|
| 5,292,677 A | * | 3/1994 | Dennison ................. | 438/396 |
| 5,338,700 A | * | 8/1994 | Dennison et al. .......... | 438/253 |
| 5,488,011 A | * | 1/1996 | Figura et al. ............ | 438/253 |
| 5,563,089 A | * | 10/1996 | Jost et al. ............... | 438/396 |
| 5,648,291 A | * | 7/1997 | Sung ..................... | 438/396 |
| 5,776,815 A | * | 7/1998 | Pan et al. ................ | 438/396 |
| 6,165,839 A | * | 12/2000 | Lee et al. ................ | 438/253 |
| 6,190,960 B1 | * | 2/2001 | Noble .................... | 438/253 |
| 6,468,859 B1 | * | 10/2002 | Parekh et al. ............ | 438/255 |
| 6,472,266 B1 | * | 10/2002 | Yu et al. ................. | 438/241 |
| 6,507,064 B1 | * | 1/2003 | Tang et al. .............. | 257/306 |
| 6,602,749 B1 | * | 8/2003 | Tu et al. ................. | 438/253 |
| 6,696,336 B1 | * | 2/2004 | DeBoer et al. ........... | 438/253 |
| 6,709,945 B1 | * | 3/2004 | McClure ................. | 438/396 |
| 6,709,972 B1 | * | 3/2004 | Park ...................... | 438/622 |
| 6,875,667 B1 | * | 4/2005 | Iizuka et al. ............. | 438/381 |
| 2003/0119252 A1 | * | 6/2003 | Park ...................... | 438/239 |

* cited by examiner

*Primary Examiner*—Mary Wilczewski
*Assistant Examiner*—Toniae M. Thomas
(74) *Attorney, Agent, or Firm*—Volentine Francos & Whitt, PLLC

(57) ABSTRACT

A method of forming a contact for a semiconductor device by forming a storage node contact in a semiconductor substrate having a first pad and a second pad formed thereon. The storage node contact is connected to the second pad. A bit line electrically insulated from the storage node contact by a spacer and electrically connected to the first pad.

20 Claims, 6 Drawing Sheets

METHOD OF FORMING CAPACITOR OVER BITLINE CONTACT

BACKGROUND OF THE INVENTION

1. Technical Field

The present invention generally relates to a method of fabricating a semiconductor device. More particularly, the present invention generally relates to a method of forming a contact in a capacitor over bitline (COB) structured semiconductor device.

A claim of priority is made to Korean Patent Application No. 2004-1966, filed on Jan. 12, 2004, the disclosure of which is hereby incorporated by reference.

2. Discussion of Related Art

Higher integration in semiconductor devices has resulted in a decrease in a memory cell area. Accordingly, the cell size for a DRAM has reduced to 1.5 $\mu m^2$ or less. For example, the reduction has been accomplished by reducing the distance between conductive layers in the cell unit. In accordance with the design rules, the distance between gate electrodes is equal to or less than a minimum feature size. A contact between a bit line and a drain region (bit line contact or direct contact), and a contact between a storage electrode and a source region (storage node contact or buried contact) have also been reduced to the minimum feature size.

As such, with the higher integration of the semiconductor device, the distance between the contact and adjacent interconnection lines has been reduced, and an aspect ratio of the contact hole has increased. A contact hole connects a lower interconnection line and an upper interconnection line. However, manufacturing reproducibility using a photolithography process to form contact holes is difficult. In addition, there are process limitations. Therefore, a self-aligned contact (SAC) method using insulating layers with different etch selectivity have been studied.

In a capacitor over bitline (COB) structure, if a capacitor is formed after the formation of a bit line, it is necessary to form a storage node contact to connect a storage electrode of the capacitor between bit lines and an active region of a semiconductor substrate. If the design rule is 0.2 $\mu$m or smaller and the storage node contact is a contact plug, a short may occur between the storage node contact and the bit line.

A conventional SAC method to prevent shorts between the storage node contact and the bit line is disclosed, for example, in U.S. Pat. No. 5,879,986. A silicon nitride layer is deposited after the forming a bit line. The silicon nitride layer is patterned to form spacers on the upper surface and the sidewalls of a bit line to prevent shorts between the bit line and a storage node contact. A silicon oxide layer is buried between the bit line, and then a contact hole is formed.

However, this conventional method has several problems.

First, if the distance between the bit lines is reduced, the overall thickness of the silicon oxide layer formed between the bit lines increases and the aspect ratio increases. During the etching process, the silicon nitride layer formed on the sidewalls of the bit line may be overetched or damaged, therefore, causing a short between the bit line and the storage node contact.

Second, if the silicon nitride spacers on the sidewalls are too thick, a void may form when the oxide layer is buried or it may be difficult to form the contact hole. These problems causes contact failures.

SUMMARY OF THE INVENTION

Therefore, the present invention is directed to provide a method of forming a contact for a semiconductor device to improve and maximize the reliability of the device by preventing shorts between a bit line and a storage node contact.

The present invention provides a method of forming a contact for a semiconductor device, which includes forming a first pad and a second pad on a semiconductor substrate, the first pad and the second pad being electrically insulated by a first interlayer insulating layer, forming a storage node contact connected to the second pad, forming a groove in the first interlayer insulating layer to expose the first pad, forming a spacer on the sidewalls of the groove, and forming a bit line in the groove and electrically connected to the first pad, whereby the bit line is electrically insulated from the storage node.

The present invention also provides a method of forming a contract for a semiconductor device, which includes forming a first pad and a second pad on a semiconductor substrate, the first pad and the second pad being electrically insulated by a first interlayer insulating layer, forming a conductive material on the first pad and the second pad, and selectively patterning the conductive material to connect the second pad to form a storage node contact line, forming a second interlayer insulating layer on the storage node contact line, partially removing the second interlayer insulating layer to form a groove intersecting the storage node contact line, removing the storage node contact line exposed by the groove to separate the storage node contact, forming a spacer on sidewalls of the groove to insulate the storage node contact, forming a bit line in the groove, and forming a capping layer on the bit line and the second interlayer insulating layer, and planarizing the capping layer to expose the storage node.

BRIEF DESCRIPTION OF THE DRAWINGS

The above and other aspects of the present invention will become more apparent to those of ordinary skill in the art by the description of the detail preferred embodiments with reference to the attached drawings in which.

DETAILED DESCRIPTION OF THE INVENTION

The present invention will now be described with reference to the accompanying drawings, in which preferred embodiments of the invention are shown.

It will be understood that when an element such as layer, region or substrate is referred to as being "on" or "onto" another element, the element is either directly on the other element or intervening elements may also be present.

Figure 1:
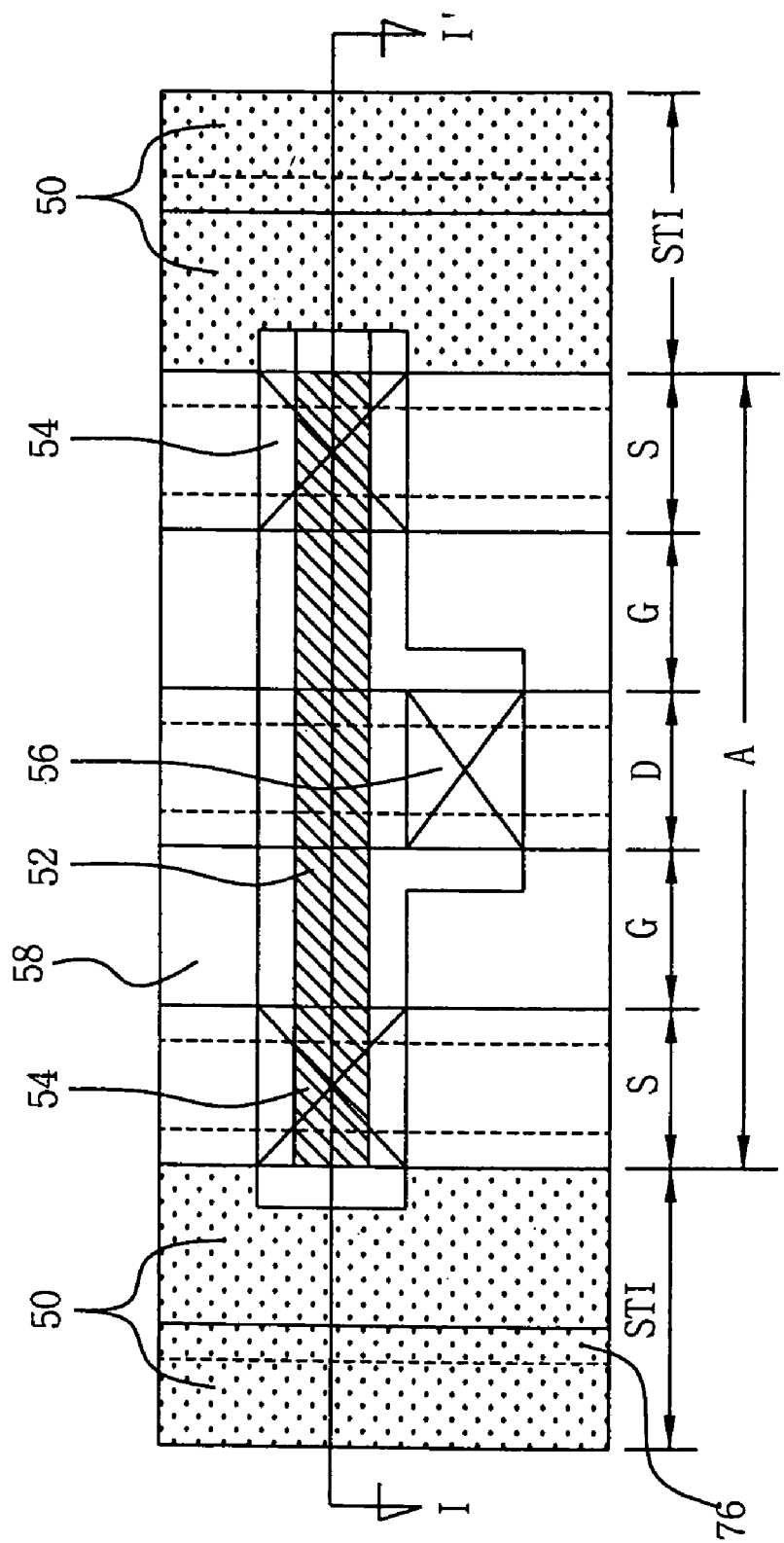
FIG. 1 is a partial plan view of a DRAM cell to schematically illustrate a contact for a semiconductor device according to the present invention.

FIG. 1 is a partial plan view of a DRAM cell to schematically illustrate a contact for a semiconductor device according to the present invention.

As shown in FIG. 1, a channel 52 isolated by a device isolation layer 50 on a semiconductor substrate is formed across an active region A. Storage node contacts 54 are formed on source regions S. A bit line contact 56 is formed on a common drain region D. In FIG. 1, storage node contacts 54 and bit line contact 56 are formed in a "T" shape.

Storage node contacts 54 and bit line contact 56, depending on the design need, may be aligned in a horizontal and/or vertical direction in the cell area, or may be aligned in a zigzag shape. Embodiments of the present invention will be explained and illustrated with reference to a DRAM having a capacitor over bitline (COB) structure, in which a gate electrode is electrically connected to a word line 58 in one direction, and a bit line 92 is formed perpendicular to word line 58. See FIG. 8.

A method of manufacturing a contact for a semiconductor device according to the present invention will be now described.

Figure 2:
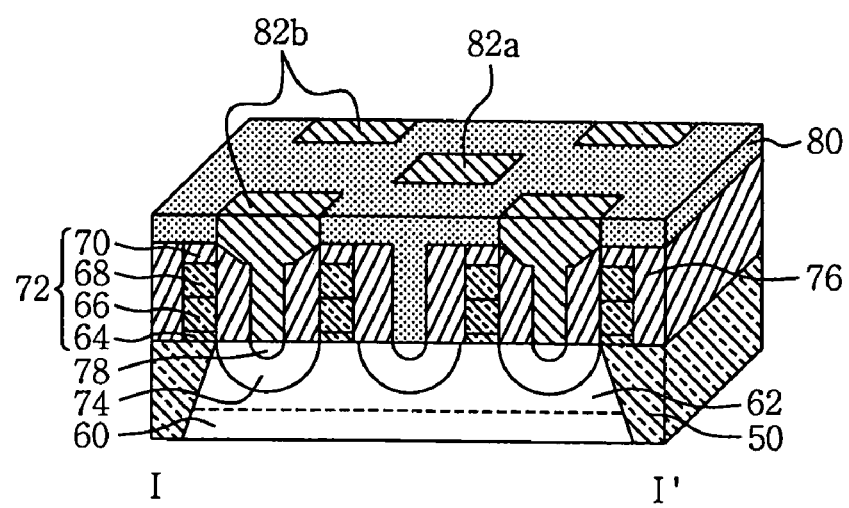
FIGS. 2 through 10 are perspective views illustrating the processing sequences for a method of forming the contact for the semiconductor device according to the present invention, taken along a line of I–I' of FIG. 1.

In FIG. 2, a device isolation layer 50 is formed using a trench process or a LOCOS process to isolate an active region A on a semiconductor substrate 60. Then, an N-type or a P-type impurity is implanted into semiconductor substrate 60 to form an impurity channel region 62. Then, a gate insulating layer 64 of silicon oxide; a gate electrode 66 of polysilicon having a conductive impurity; a metal layer 68 such as tungsten silicide or titanium silicide; and an upper gate insulating layer 70 of silicon nitride or silicon oxynitride are respectively formed on semiconductor substrate 60. Gate insulating layer 64, gate electrode 66, metal layer 68, and upper gate insulating layer 70 are formed by a low pressure chemical vapor deposition (LPCVD) process, or a plasma enhanced chemical vapor deposition (PECVD) process. After exposing the surface of the source/drain regions S/D of semiconductor substrate 60 by a photolithography process, a gate stack 72 is formed in a gate region G (FIG. 1). Then, an N-type or a P-type impurity is implanted using gate stack 72 as an ion implantation mask to form a first impurity region 74 on source/drain regions S/D. On the resultant structure, a first silicon nitride layer (not shown) is formed. Using a dry etchant with an excellent vertical etch properties, the first silicon nitride layer is removed to expose the surface of source/drain region S/D to form a first spacer 76 on the sidewalls of gate stack 72. Then, using first spacer 76 as an ion implantation mask, i.e., a self-aligned method, an N-type or a P-type conductive impurity is implanted into source/drain regions S/D to form a second impurity region 78.

Then, a first interlayer insulating layer 80 of silicon oxide is formed on the resultant structure. Using a photolithography process, first interlayer insulating layer 80 is partially removed to form a first contact hole (not shown) over the source/drain regions S/D. A polysilicon layer having conductive impurities is formed on the overall surface thereon. Afterwards, using a chemical mechanical polishing (CMP) process, the polysilicon layer is removed to expose first interlayer insulating layer 80 and to form a first pad 82*a* and a second pad 82*b*, which are electrically connected to source/drain regions S/D through the first contact hole.

In an optional method, a first polysilicon layer may be formed first on second impurity region 78. Using a CMP process the first polysilicon layer is partially removed to expose upper gate insulating layer 70. A first interlayer insulating layer 80 is formed on the overall surface of semiconductor substrate 60 having the first polysilicon layer formed thereon. Then first interlayer insulating layer 80 is removed to form a first contact hole. A second polysilicon layer is formed on the overall surface of semiconductor substrate 60 having the first contact hole formed thereon. Then the second polysilicon layer is removed to expose first interlayer insulating layer 80 and to form a first pad 82*a* and a second pad 82*b* on the source/drain regions S/D.

Figure 3:
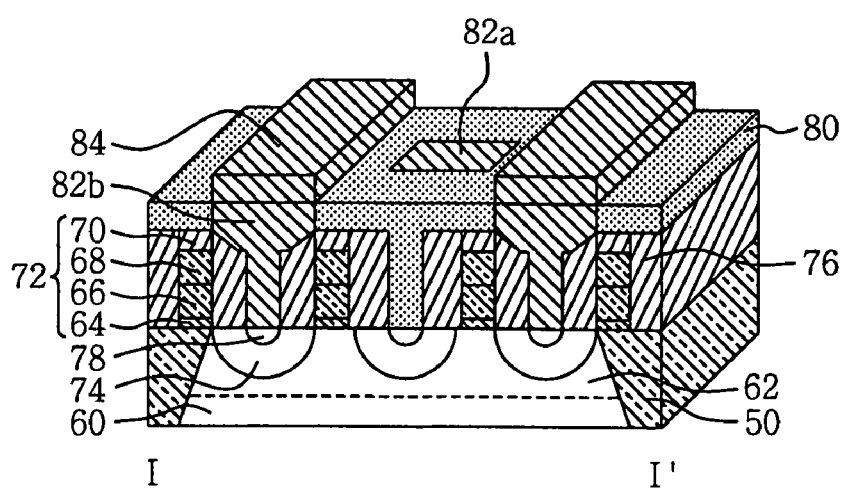

In FIG. 3, a second polysilicon layer (not shown) having a conductive impurity is formed after the planarization step above. A first photoresist layer (not shown) is deposited on the second polysilicon layer, and then the first photoresist layer is patterned using a photolithography process. Using the patterned first photoresist layer as an etch mask, the polysilicon layer is partially removed to form a storage node contact line 84. For example, using a LPCVD or PECVD process, the second polysilicon layer is formed to a thickness of about 1500 to 3000 Å. Further, storage node contact line 84 is formed in parallel with a word line 58. Storage node contact line 84 is connected to second pad 82*b*. A dummy line may be optionally formed in parallel with storage node contact line 84.

Figure 4:
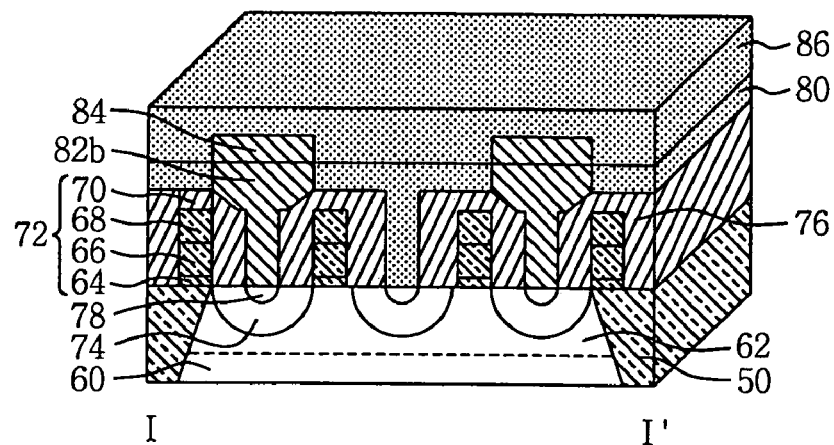
Figure 8:
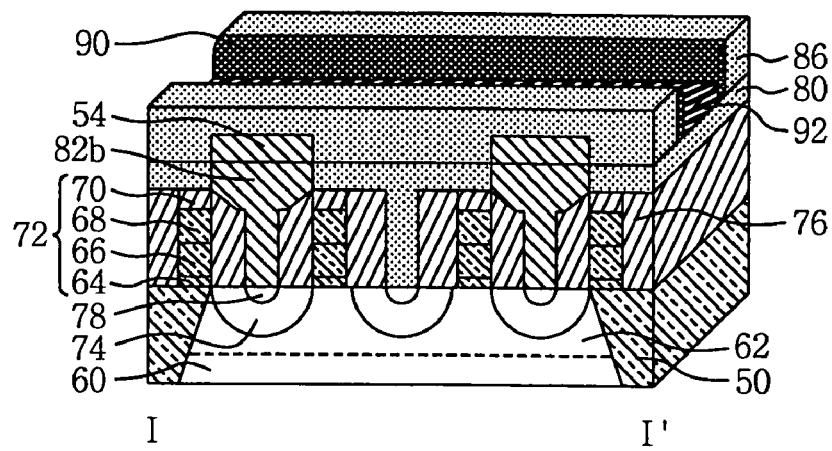

In FIG. 4, a second interlayer insulating layer 86 of silicon oxide is formed on the resultant structure. By a CVD process, second interlayer insulating layer 86 is formed to about 2000 to 5000 Å. Second interlayer insulating layer 86 functions as a hard mask layer to form a bit line 92 (FIG. 8).

Figure 5:
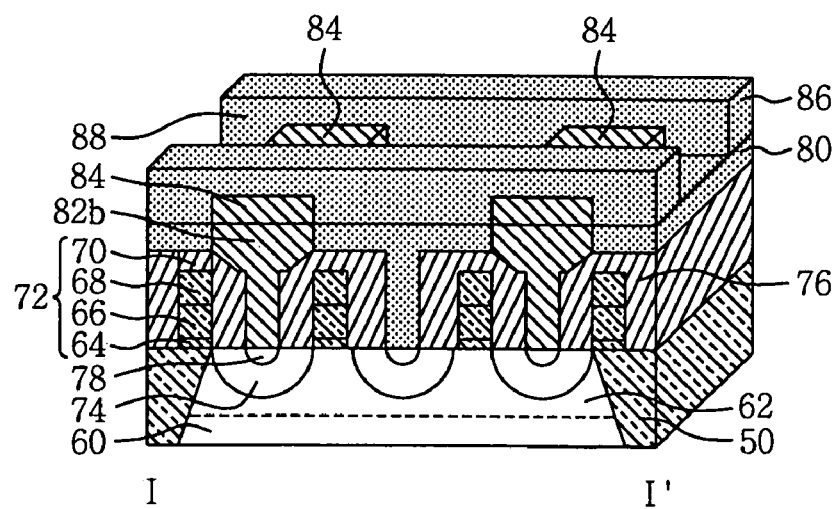

In FIG. 5, a second photoresist layer (not shown) is deposited on second interlayer insulating layer 86. The second photoresist layer is patterned using a photolithography process. Using the patterned second photoresist layer as an etch mask, second interlayer insulating layer 86 is partially removed by a dry etch process to expose first interlayer insulating layer 80 and storage node contact line 84, and to form a groove 88 perpendicular to storage node contact line 84. Groove 88 is formed using a reactant gas such as $C_4F_6$ or $C_5F_8$ having an etch selectivity relative to the polysilicon of storage node contact line 84. The width of groove 88 is about 1000 to 3000 Å. Further, in the case a dummy line is formed, groove 88 is preferably formed with a depth less than the thickness of second interlayer insulating layer 86.

Figure 6:
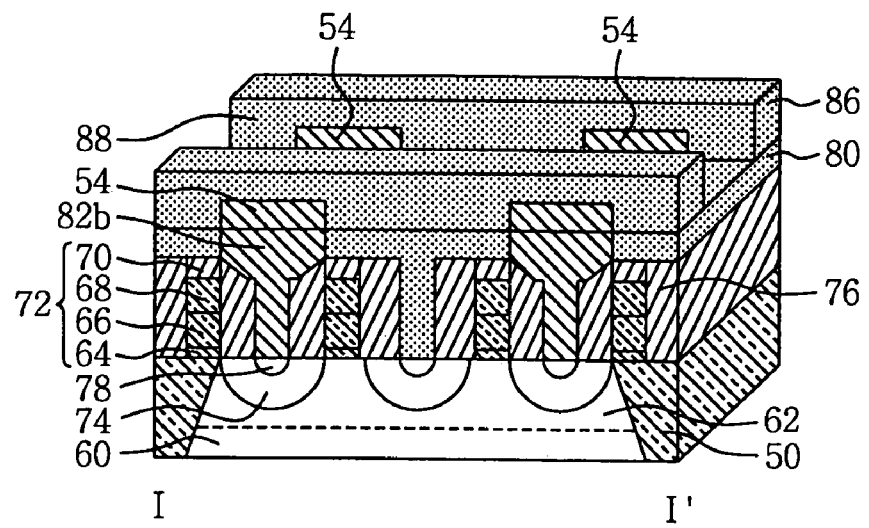

In FIG. 6, the exposed portion of storage node contact line 84 is removed by a dry etch process to form a storage node contact 54. The dry etch process uses a reactant gas of $Cl_2$, $SF_6$, or HBr. The dummy line may also be etched to expose first pad 82*a*. The width of groove 88 must be greater than that of first pad 82*a* to remove the dummy line.

Figure 7:
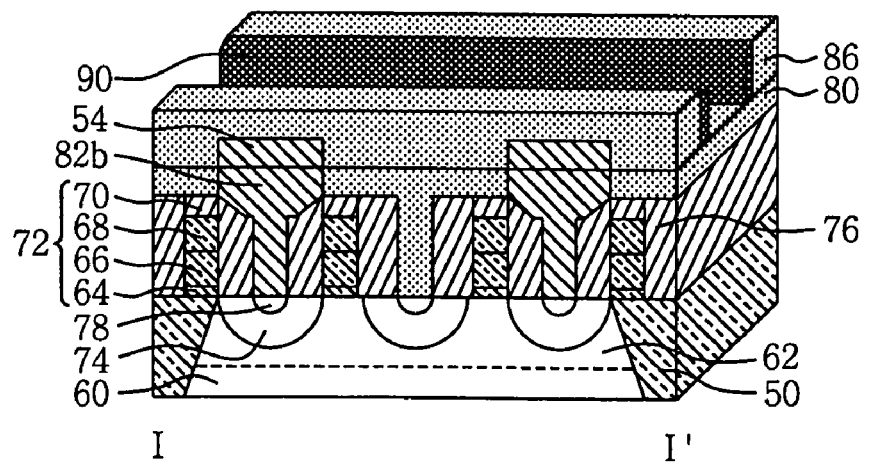

In FIG. 7, a second silicon nitride layer is formed, and then partially removed to form a second spacer 90 on the sidewalls of groove 88. Second spacer also electrically insulates storage node contact 54. Second spacer 90 is formed to have excellent step coverage in groove 88 such as the sidewalls of groove 88. Using the vertical etching characteristics of a dry etchant, storage node contact 54 and the dummy line are insulated on the sidewalls of groove 88 rather than on the surface of second interlayer insulating layer 86 or first interlayer insulating layer 80.

The second silicon nitride layer is formed to a thickness of about 150 to 300 Å. The second silicon nitride layer is removed using a reactant gas such as $CH_2F$, $CHF_3$, or $CF_4$. Further, groove 88 has a width equal to or greater than about 800 Å.

Therefore, in the method of forming a contact for a semiconductor device according to the present invention, shorts which may occur between a bit line 92 (FIG. 8) and storage node contact 54 are prevented, because storage node contact 54 is electrically insulated by second spacer 90.

In FIG. 8, a conductive metal layer such as tungsten (W) or aluminum is formed on second interlayer insulating layer 86 and in the groove 88. The conductive line is partially removed by a dry etching process to form a bit line 92 with a thickness of at least 800 Å or greater on the bottom of groove 88. The conductive metal layer is formed using a sputtering, MBE, or a thermal deposition process. Further, bit line 92 is electrically insulated from storage node contact 54 by second spacer 90. Bit line 92 is formed to have a step height difference of at least about 700 Å or greater relative to storage node contact 54.

Therefore, the method of forming a contact of a semiconductor device according to the present invention prevents or minimizes contact failures by first forming storage node contact 54, and then forming bit line 92 to electrically insulate storage node contact 54 by second interlayer insulating layer 86 and second spacer 90.

Figure 9:
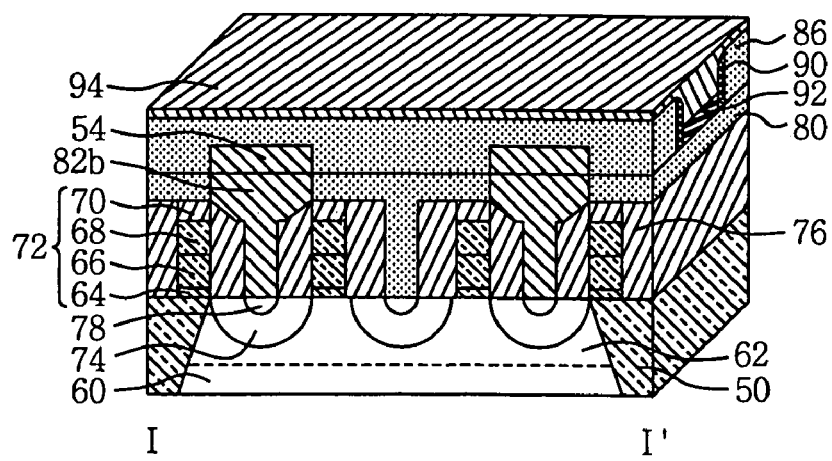

In FIG. 9, a silicon nitride capping layer 94 is formed by a low temperature CVD or PECVD process to a thickness of about 1500 to 3000 Å. Bit line 92 is connected to first pad 82a. Bit line 92 is additionally electrically insulated by second spacer 90 and capping layer 94.

Figure 10:
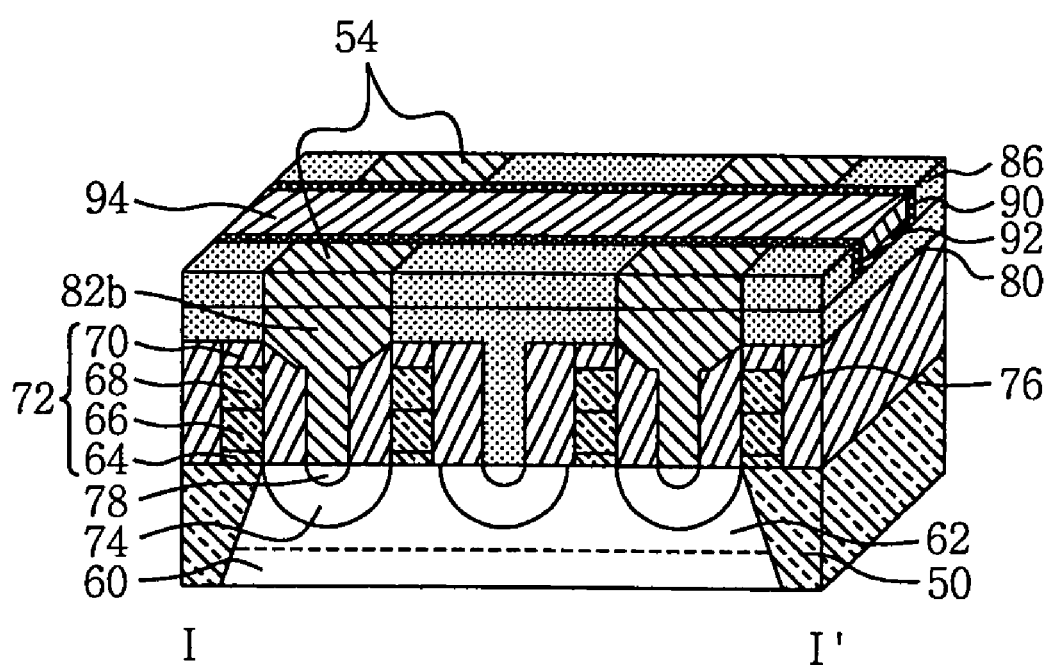

In FIG. 10, a CMP or an etch-backed process is performed to partially remove capping layer 94 and second interlayer insulating layer 86 to expose storage node contact 54.

Then, a sacrificial oxide layer (not shown) with a predetermined thickness is formed on the semiconductor substrate 60. The sacrificial oxide layer is patterned to form a trench and expose storage node contact 54. Subsequently, a storage electrode, a dielectric layer, a plate electrode are sequentially formed on the overall surface to complete the manufacturing of the semiconductor memory device.

In particular, storage node contact line 84 and dummy line may be aligned in various configurations. In addition, the first and second polysilicon layers, storage node contact line 84, and the dummy line may be composed of various materials. Further, groove 88 may be formed by partially removing second interlayer insulating layer 86 or first interlayer insulating layer 80. Groove 88 may also have various depth dimensions.

The present invention has been described using preferred exemplary embodiments. However, it is to be understood that the scope of the invention is not limited to the disclosed embodiments.

What is claimed is:

1. A method of forming a contact for a semiconductor device, comprising:
    forming a first pad and a second pad on a semiconductor substrate, the first pad and the second pad being electrically insulated by a first interlayer insulating layer;
    forming a storage node contact connected to the second pad;
    forming a second insulating layer over the first interlayer insulating layer, the storage node, and the first pad;
    forming a groove in the second interlayer insulating layer to expose the first pad and the storage node;
    forming a spacer on the sidewalls of the groove; and
    forming a bit line in the groove and electrically connected to the first pad, wherein the bit line is electrically insulated from the storage node by the spacer.

2. The method according to claim 1, further comprising etching a portion of the storage node within the groove to define a sidewall of the storage node exposed within the groove, wherein the spacer is formed on the sidewall of the storage node within the groove.

3. The method according to claim 1, wherein the bit line is formed higher than the storage node contact.

4. A method of forming a contact of a semiconductor device, comprising:
    forming a first pad and a second pad on a semiconductor substrate, the first pad and the second pad being electrically insulated by a first interlayer insulating layer;
    forming a conductive material on the first pad and the second pad, and selectively patterning the conductive material to connect the second pad to form a storage node contact line;
    forming a second interlayer insulating layer on the storage node contact line;
    partially removing the second interlayer insulating layer to form a groove intersecting the storage node contact line;
    removing the storage node contact line exposed by the groove to separate the storage node contact;
    forming a spacer on sidewalls of the groove to insulate the storage node contact;
    forming a bit line in the groove; and
    forming a capping layer on the bit line and the second interlayer insulating layer, and planarizing the capping layer to expose the storage node.

5. The method according to claim 4, wherein the storage node contact is formed to a thickness of about 1500 Å to 3000 Å.

6. The method according to claim 4, wherein the storage node contact is formed using polysilicon doped with conductive impurities.

7. The method according to claim 4, wherein the first and the second interlayer insulating layers are formed of a silicon oxide layer.

8. The method according to claim 4, wherein the second interlayer insulating layer is formed to a thickness of about 2000 to 5000 Å.

9. The method according to claim 4, wherein the groove is formed to have an open critical dimension of about 1000 to 2000 Å.

10. The method according to claim 4, wherein the step of forming the spacer, comprises:
    forming an insulating layer in the groove; and
    dry etching the insulating layer to form the spacer on sidewalls of the groove.

11. The method according to claim 10, wherein the insulating layer is silicon nitride.

12. The method according to claim 10, wherein the insulating layer is formed to a thickness of about 150 to 300 Å.

13. The method according to claim 4, wherein the step of forming the bit line, comprises:
    forming a conductive material in the second interlayer insulating layer and the groove having the spacer formed therein; and
    removing the conductive material on the second interlayer insulating layer to form the bit line on bottom of the groove.

14. The method according to claim 13, wherein the conductive material is tungsten or aluminum.

15. The method according to claim 13, wherein the conductive material is removed using a dry etch process.

16. The method according to claim 13, wherein the bit line is formed to a thickness of least about 800 Å.

17. The method according to claim 4, wherein the capping layer is silicon nitride.

18. The method according to claim 4, wherein the capping layer is planarized by a chemical mechanical polishing (CMP) process.

19. The method according to claim 16, wherein a step difference between the bit line and storage node is at least about 700 Å.

20. The method according to claim 4, wherein a width of the groove is about 1000 to 3000 Å.

* * * * *